United States Patent [19]

Chengson et al.

[11] Patent Number: 5,041,747
[45] Date of Patent: Aug. 20, 1991

[54] DELAY REGULATION CIRCUIT

[75] Inventors: David P. Chengson, Mountain View; H. William Wang, Saratoga, both of Calif.

[73] Assignee: Tandem Computers Incorporated, Cupertino, Calif.

[21] Appl. No.: 889,439

[22] Filed: Jul. 23, 1986

[51] Int. Cl.$^5$ .................. H03K 5/13; H03K 5/159
[52] U.S. Cl. .................. 307/591; 307/597; 307/601; 307/455; 307/270; 307/303
[58] Field of Search .............. 307/268, 590, 591, 600, 307/601, 602, 603, 605, 608, 590, 587, 592, 303, 455, 456, 300; 328/55, 56; 340/347 DA

[56] References Cited

U.S. PATENT DOCUMENTS

| | | | |
|---|---|---|---|
| 3,423,638 | 1/1969 | Dix et al. | 357/74 |
| 4,150,366 | 4/1979 | Price | 340/347 DA |
| 4,227,185 | 10/1980 | Kronlange | 340/347 NT |
| 4,687,953 | 8/1987 | Varadarajan | 307/455 |

FOREIGN PATENT DOCUMENTS 0151875  8/1985  Japan .................. 307/590

OTHER PUBLICATIONS

H. Remshart, "Tolerance Trimming of Electrical Data of LSI" IBM Technical Disclosure Bulletin, vol. 20, No. 8, Jan. 1978.

Primary Examiner—Stanley D. Miller
Assistant Examiner—Tai V. Duong
Attorney, Agent, or Firm—Townsend and Townsend

[57] ABSTRACT

An integrated circuit chip carries a number of electronic circuits, at least one of which includes, in its output stage, a control device that responds to a reference signal to adjust the output current-handling capability of the electronic circuit, thereby regulating the signal propagation delay exhibited by the electronic circuit. The reference circuit is generated by a digital-to-analog circuit that is also formed on the chip. The digital-to-analog circuit is coupled to a number of contact elements disposed on an outer surface of the package containing the integrated circuit chip that can be selectively interconnected to a DC voltage to choose the value of the reference signal.

15 Claims, 3 Drawing Sheets

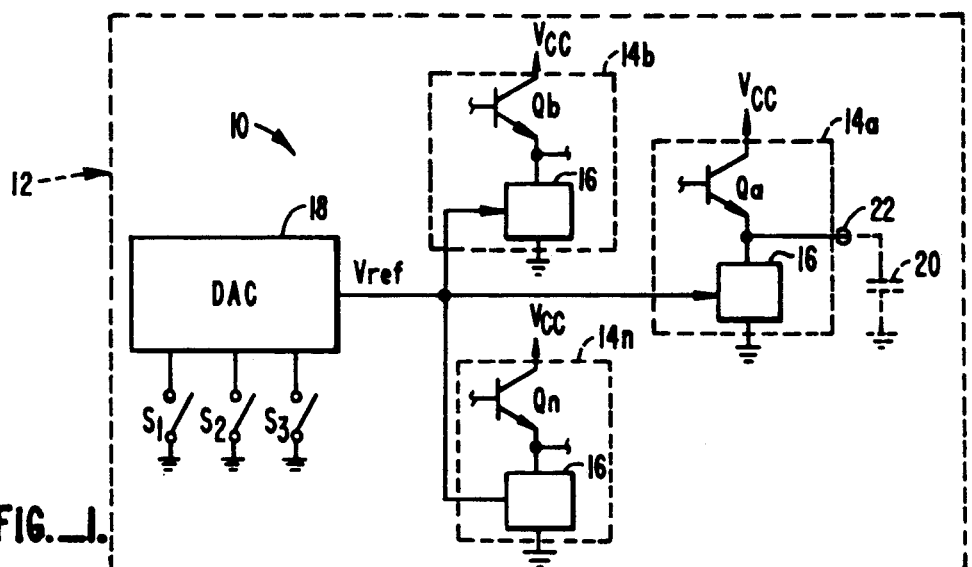
FIG._1.
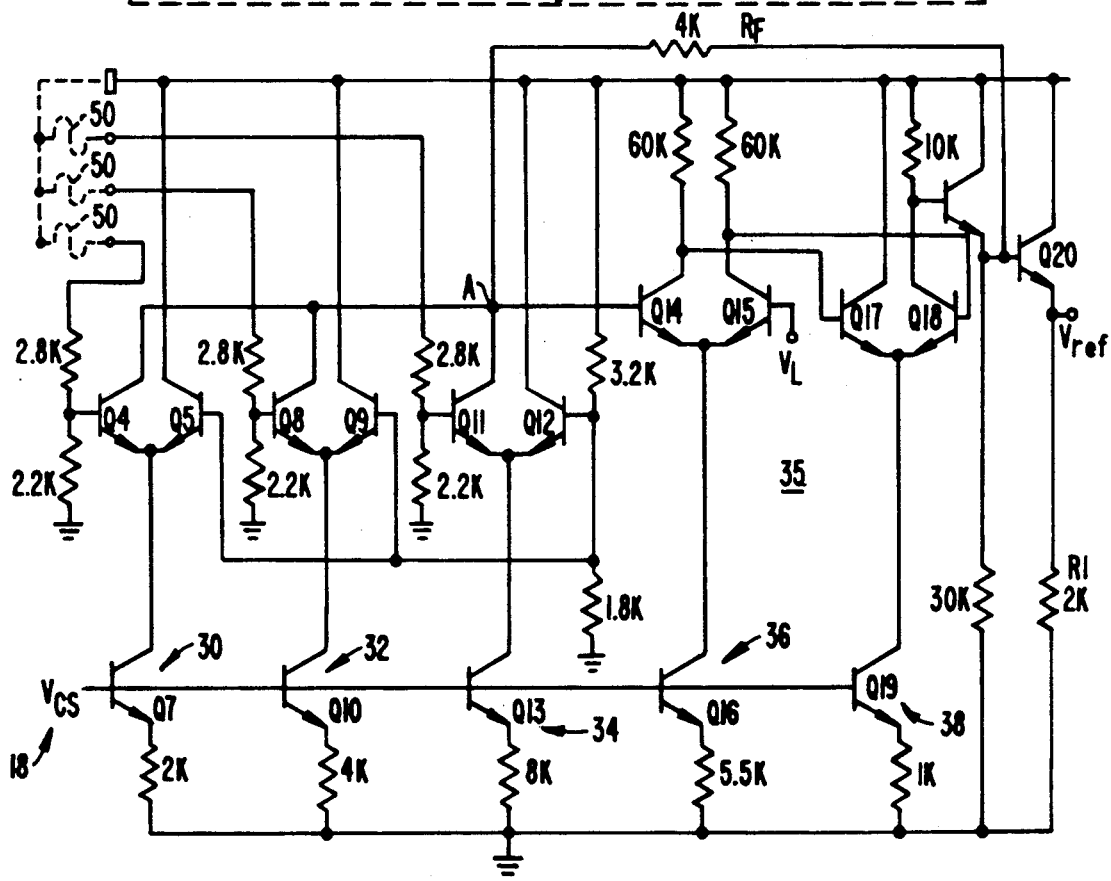
FIG._2.
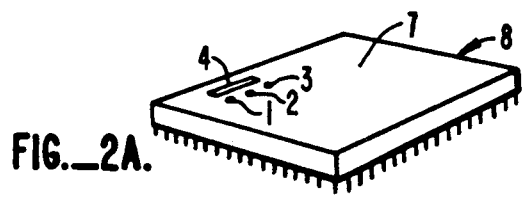
FIG._2A.

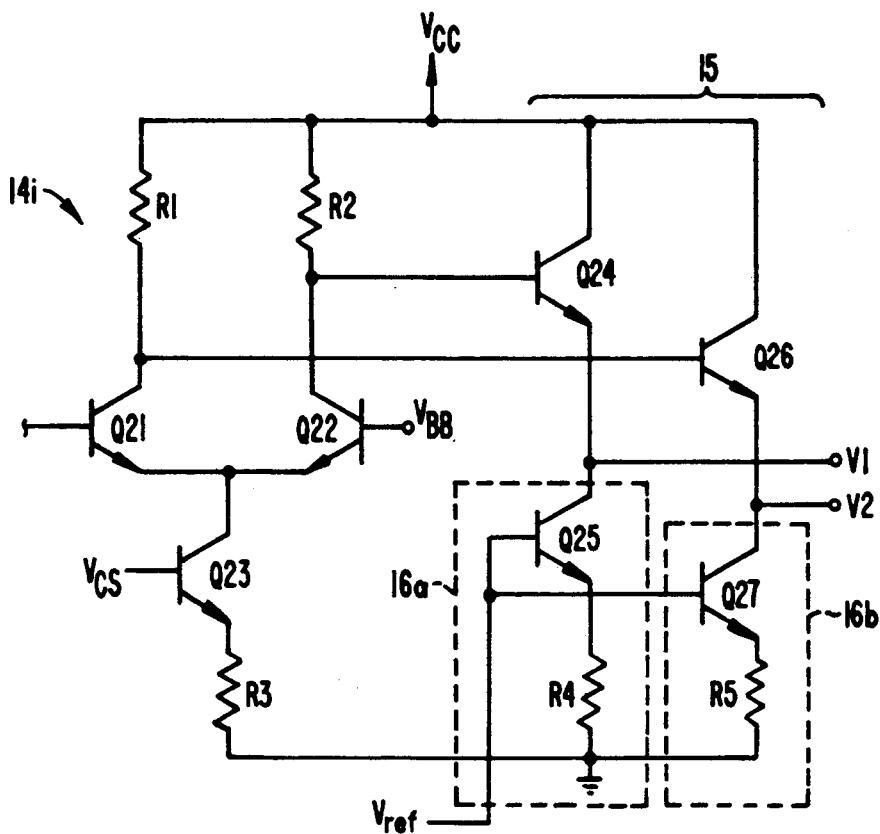
FIG._3.
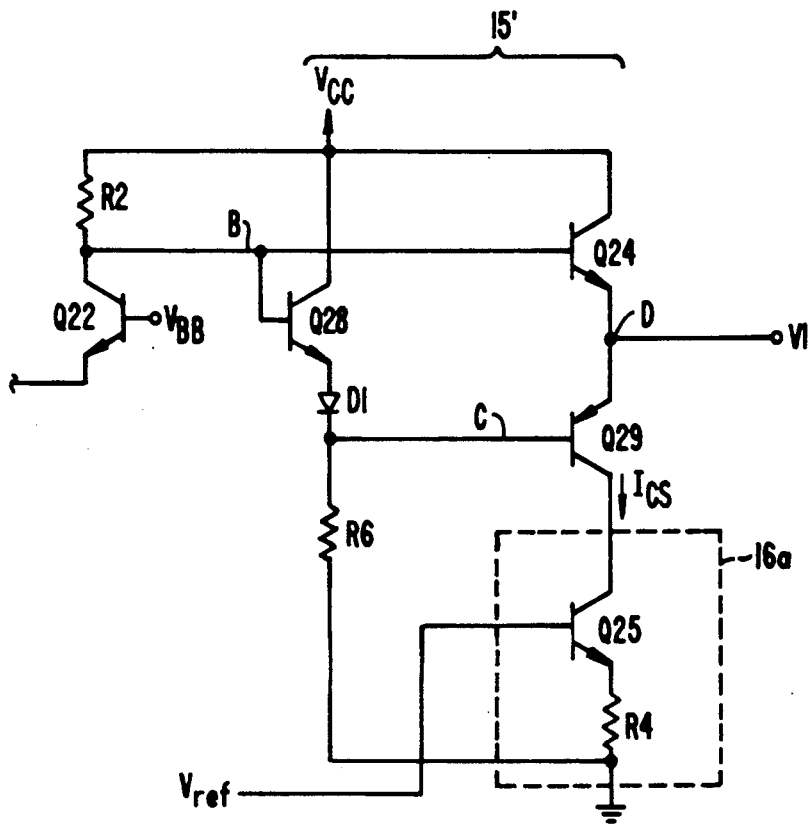
FIG._4.

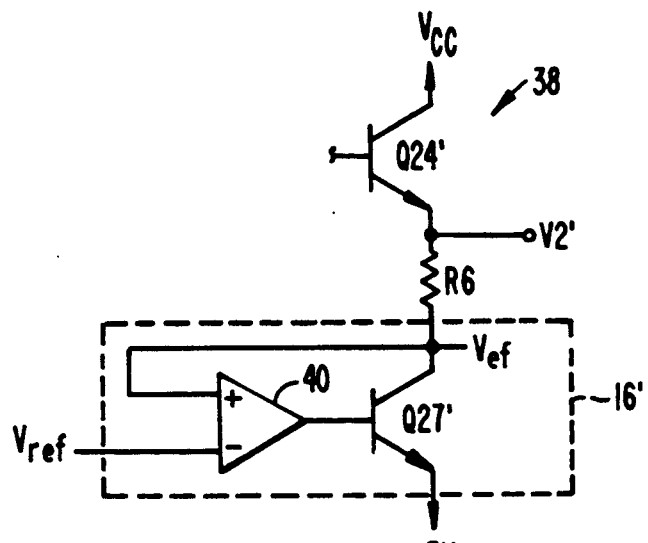
FIG._5.
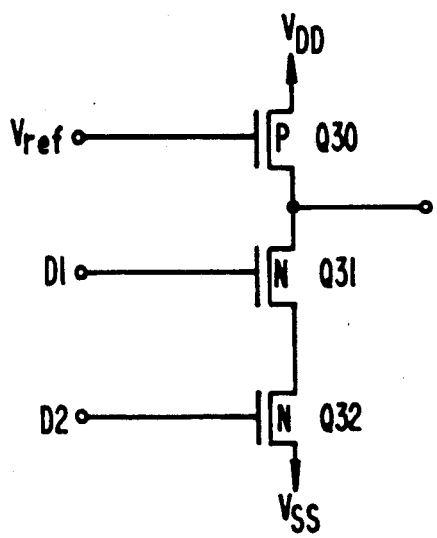
FIG._6.
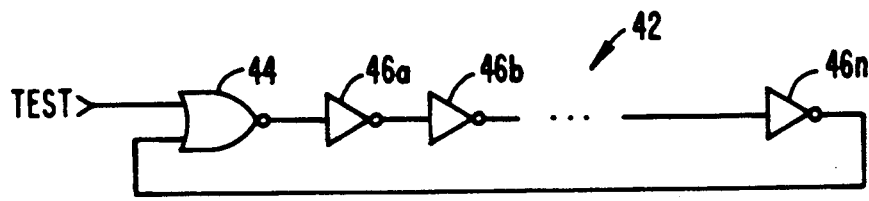
FIG._7.

DELAY REGULATION CIRCUIT

BACKGROUND OF THE INVENTION

The present invention relates generally to integrated semiconductor digital circuits, and more particularly to regulation of signal propagation delay presented by individual ones of a number of electronic circuits formed on an integrated circuit chip.

It is well known that the speed of electronic circuits (i.e., the propagation delay exhibited by a gate of an electronic digital circuit) formed on a semiconductor circuit chip can vary from chip to chip due to process variations. Typically, such gate delays can vary as much as 30% from chip to chip, and must be taken into account by designers. For example, a designer must be aware of the fact that when his or her design is fabricated in integrated circuit form, one particular chip may operate faster (have smaller gate delays) or slower (have greater gate delays) than another identical chip. The designer must be aware of the maximum and minimum limits of gate delay variations, and take them into account to make sure that digital signals converge at the inputs of any particular digital gate when they should, and/or remain long enough to be acted upon.

Of course, circuit manufacturers can tighten their specifications to reduce process variations experienced during integrated circuits fabrication. However, this solution can be very expensive. Accordingly, a happy medium is reached between a circuit speed variation that can be tolerated and fabrication expense. The result: Speed of the circuitry is reduced; good circuit design practice requires that the circuits of the chip be designed with operating speeds at the lower end of the variation range—even if not always true on an individual chip basis.

There have been techniques proposed that provide dynamic regulation of an electronic circuit's delay. These techniques, however, are generally limited to controlling small circuit operating parameters in the internal switching and amplifying sections of the gate. It has been found, however, that process variations, insofar as gate delays are concerned, often affect the output stages of a gate. This is because a digital gate typically drives a number of other gates, and must, therefore, be capable of sourcing (or sinking) relatively large output currents during output transitions. Process variations can cause concomitant variations in the impedance (primarily capacitance) seen by these output stages which affect the time it takes for the gate's output to change from one state to another.

SUMMARY OF THE INVENTION

Accordingly, the present invention provides a post-processing technique for adjusting gate delays to compensate for process variations by static regulation of the output current range of an electronic circuit formed on an integrated circuit chip. The technique narrows the range of signal propagation delays that must be tolerated by a designer, allowing the overall circuit regulated by the present invention to operate at higher circuit speeds.

In the preferred embodiment of the invention, a digital-to-analog circuit (DAC) is formed on the integrated circuit chip carrying the electronic circuit or circuits to be regulated. The DAC is constructed so that it can be programmed to selectively provide one of a number of reference signals (voltages). The reference signal is coupled to a control device that forms a part of the output stage of each of the regulated gate or gates, operating in response to the reference signal to set the gate's output current range and, thereby, the switching speed (primarily, the low to high transition) of the gate.

Programming the DAC may be accomplished in a variety of ways. However, the preferred embodiment of the invention uses emitter-coupled transistor pairs operating in a current-switching mode. The base circuit of one transistor of each pair is brought out to an external contact point disposed on the circuit package containing the invention. Any or all of the pins may be mechanically connected to a voltage to cause current to be carried through one or the other of the transistors of each pair, producing a summed current that is indicative of the programming, and used to produce the reference signal.

In operation, an integrated circuit chip that includes the present invention is tested to determine the gate delays of the gates making up the integrated circuit. Although within the manufacturer's guaranteed specifications, the delay may be out of the range desired. Accordingly, once so tested, one or more of the contact pins are connected or left alone as necessary to cause the (on-board) digital-to-analog circuit to produce a reference signal that, through the control device, adjusts the current-carrying capability of the gate's output stage.

As an example: The present invention is developed to regulate digital gates formed using emitter-coupled (ECL) technology. Such gates typically use an emitter-follower configuration output. As noted above, process variations can affect and vary the impedance the gate's output stage must operate into, causing a gate to work into a larger impedance in chips produced on one occasion, and the same gate to a smaller impedance when fabricated on another occasion. Thus, the gate, designed to have a predetermined current with an optimum output impedance will exhibit a greater signal propagation delay in the former case than in the latter. The solution provided by the present invention is to give the output stage greater current-handling capability in the former case, and to reduce the current-handling capability in the latter case.

One advantage of the present invention is that circuits formed on integrated circuit chips can be designed to much tighter timing tolerances with no increase in manufacturing costs. In addition, the ability to design an integrated circuit with much tighter timing produces higher operating speeds.

Another advantage of the present invention is that it forms a basis for adding inexpensive circuitry that provides active pull-down. This operates to sharpen the falling edges (high to low transitions) of output signals produced by circuits employing the present invention.

These and other advantages will become more apparent to those skilled in this art upon a reading of the following detailed description of the invention, in conjunction with the accompanying drawings.

BRIEF DESCRIPTION OF THE DRAWINGS

FIG. 1 is a block diagram representation of the present invention, illustrating the delay regulation circuit to adjust the signal propagation delay exhibited by certain of the electronic circuits formed on an integrated circuit chip;

FIG. 2 is a circuit diagram of the digital-to-analog converter, shown in FIG. 1, used to generate the reference signal ($V_{ref}$);

FIG. 2A illustrates an integrated circuit package, showing the control pins that are made available at the top of the package for programming the digital-to-analog circuit of the present invention to obtain a desired reference voltage;

FIG. 3 is a circuit representation of an output stage of representative electronic circuit regulated by the present invention, showing control devices in the form of current sources that set the range of the output current of the electronic circuit in response to the reference signal;

FIG. 4 illustrates the ability of the output stage of FIG. 3 to accept an active pull-down circuit that operates to sharpen falling edges of the output signal produced by the stage;

FIG. 5 illustrates an alternate embodiment of the present invention, showing control of the electronic circuit's output current by adjusting the effective voltage V of the lower potential used by the output stage; and FIG. 6 illustrates implementation of the invention in MOS circuit technology; and FIG. 7 is an illustration of a representative test circuit used to determine the delay of the electronic circuits formed on an integrated circuit chip carrying the test circuit.

DETAILED DESCRIPTION OF THE INVENTION

In FIG. 1, the delay regulation circuit of the present invention, designated generally by the reference numeral 10, is diagrammatically illustrated as being formed on a semiconductor substrate or integrated circuit "chip" 12, together with a plurality of digital electronic circuits or logic "gates" 14a, 14b ... 14n. The gates 14a, 14b, ... 14n can take a number of forms, such as NAND gates, NOR gates, and inverters; combined, they can form flip-flops, registers, etc. Gates 14a, 14b, ... 14n represent a variety of such circuit elements and, although only a few are shown in FIG. 1, the gates 14a, 14b, ... 14n can be very large in number. However, so far as is important here, they all have one thing in common: An output stage that includes an emitter-follower type circuit configuration that operates to drive an output terminal. Thus, as FIG. 1 illustrates, the gates 14a, 14b, ... 14n all have output stages that include emitter-follower transistors Qa, Qb, ... and Qn, respectively.

The delay regulation circuit 10 includes a control device 16 that is situated in the emitter circuit of each of the output transistors Qa–Qn. A digital-to-analog converter (DAC) 18 operates to supply a reference voltage $V_{ref}$ that can be set to a particular value by operation of switches $S_1$, $S_2$ and $S_3$.

During operation, the output stages of the various electronic circuits 14a–14n must contend with certain amounts of output impedance, often capacitive in nature. This is illustrated in phantom in FIG. 1 by the capacitor 20 that is connected to the output lead 22 of gate 14a. The other electronic circuits 14b–14n would have similar output impedances to work into, although not specifically shown.

As explained above, it is this output impedance (capacitance 20) that causes, in large part, the signal propagation delays experienced from chip to chip. (As used herein, signal propagation delay refers to that amount of time beginning with the application—rising edge or falling edge—of a signal to an electronic circuit, and ending with the output of that signal —falling edge or rising edge—from the electronic circuit.) Process variations affect not only the make-up of the individual circuit 14a–14n themselves, but also the impedances, such as the capacitance 20, into which the electronic circuits work. A significant component of the speed of the circuit is the amount of current (i.e., the rate of charge transfer per unit time) that the circuit is capable of handling. The speed of the circuit, therefore, depends upon how fast the output capacitance 20 can be charged and/or discharged. Certain integrated circuit chips 12 may undergo processes that produce electronic circuits 14a–14n capable of much faster charge/discharge times than other circuit processes.

Thus, it is a primary objective of the present invention to provide means for post-process adjustment of the current-handling capability of output circuits to, in turn, adjust the signal propagation delay that may be associated with the gates 14a, 14b, ... 14n carried by an integrated circuit chip 12. For example, a pair of integrated circuit chips 12 may be produced at different times, resulting in one chip having a propagation delay of t1, while the other has a propagation delay of t2, where t1 is greater than t2. The present invention is capable of operating on both types. Thus, the faster chip 12 (the one having the delay time of t2) can be slowed down by decreasing the capability of the output circuit to transfer charge, i.e., to decrease its current-handling capability. In similar fashion, the integrated circuit chip exhibiting the slower signal propagation delay time t1 can have its speed increased by increasing the amount of charge its output stages can transfer per unit time, i.e., increasing its current-handling capability. This is the function of the control devices 16.

In operation, the delay times of the electronic circuits 14a–14n are determined in a manner that will be discussed more fully below. Armed with this information, a further determination can be made as to whether the circuit delays should be adjusted. If so, switches S1, S2 and S3 can be opened or closed, as necessary, to generate a reference signal $V_{ref}$ that corresponds to a control circuit 16 operation that achieves the desired adjustment. Upon receipt of $V_{ref}$, the control devices 16 will be set to a corresponding state that either increases or decreases the current-handling capability of the output stages of the respective electronic circuits 14a–14n to adjust the delay as indicated by the initial determination of delay times.

Turning now to FIG. 2, the circuit diagram of the DAC 18 is illustrated. DAC 18 is shown as being formed by emitter-coupled transistor pairs Q4/Q5, Q8/Q9 and Q11/Q12. One transistor of each pair has a collector lead that connects to a current node A, and a base lead that is connected to a resistive voltage divider circuit that, in turn, connects to an external contact 1, 2, 3. The other transistor of each pair connects to a supply voltage $V_{cc}$. The emitters of each pair Q4/Q5, Q8/Q9 and Q11/Q12 connect to current sources 30, 32 and 34, respectively, which supply the current (set by the bias voltage $V_{cs}$ applied to the base leads of the transistors Q7, Q10 and Q13) switched by each transistor pair.

The switches S1, S2, S3 are implemented using the external contacts 1, 2, 3, which are brought out to an accessible location of the packaging containing the invention. Thus, for example, as illustrated in FIG. 2A, the external contacts 1, 2, 3 appear on a top surface 7 of the integrated circuit package 8 and, together with the external contact 4 that connects to $V_{cc}$, operate to implement a method of programming DAC 18. Thus, for example, depending upon whether the external contacts 1, 2, 3 are left undisturbed and allowed to float or are electrically connected to the external contact 4 (thereby connecting the associated base circuit of one of the transistors Q4, Q8, Q11 to $V_{cc}$ via 2.8K Ohm resistors) they will function to switch the current sources 30–34 through one or the other of the transistors of the corresponding emitter-coupled pairs Q4/Q5, Q8/Q9. The binary weighting of the current produced by the current sources 30–34, depending upon the current path selected, will produce a total current that is summed at the node current A and applied to a base lead of transistor Q14. With transistor Q15, transistor Q14 forms an emitter-coupled pair that functions as the input of a differential amplifier 35 that includes comprising the emitter-coupled pair Q16/Q17 and current sources 36 and 38. The differential amplifier 35 amplifies the current received at the base lead of transistor Q14 to form the reference signal $V_{ref}$ which is amplified by transistor Q20 before being coupled to control circuits 16.

The external contacts 1, 2, 3, 4 provide the capability of selecting one of eight available increments of $V_{ref}$, depending upon the particular connections made. The lowest value of $V_{ref}$ is determined by the DC voltage ($V_L$) applied to the base lead of the transistor Q15, which forms the positive input side of the differential amplifier 35. A feedback resistor $R_F$, provides negative feedback for the amplifier, and the product of tis value and the least significant bit current determines increment values that the control devices 16 can adjust.

The present invention was developed for use in emitter-coupled logic (ECL) of the type having complementary data outputs, and output stages (drivers) being in the form of emitter followers. Illustrated in FIG. 3 is a representative ECL gate 14$i$ having an output portion 15, and showing control devices 16$a$ and 16$b$ inserted in place of what normally would be the emitter resistance. The control devices 16$a$, 16$b$ are identical in structure, function and operation. Accordingly, only the structure, function and operation of the control device 16$a$ will be described, it being understood that any discussion of control device 16$a$ will apply equally to control device 16$b$ of FIG. 3.

As FIG. 3 shows, the control device 16$a$ includes a transistor Q25 and a resistance R4 inserted in series between the emitter lead of the transistor Q24 and a ground potential. The transistor/resistor Q25/R4 combination form a current source that is controlled by the reference signal $V_{ref}$ applied to the base terminal of the transistor Q25.

In operation, during post processing tests the signal propagation delays exhibited by the gates 14$a$, 14$b$, ... 14$n$ formed on the integrated circuit chip 12 (FIG. 1) are determined. During this determination, the DAC 18 (FIG. 2) that is also formed on the integrated circuit chip generates a reference signal $V_{ref}$ that is representative of the external contacts 1, 2, 3 floating, causing the corresponding base leads (of transistors Q4, Q8 and Q11) to be pulled to ground. If the measured signal propagation delay time is found to be higher than desired, the current-handling capability of the output stages, including output stage 15 (FIG. 3), must be increased. Thus, depending upon the amount of increase needed, selected ones or all of external contacts 1, 2, 3 are connected to the supply voltage (via external contact 4) to produce a reference signal $V_{ref}$ sufficient to cause the transistor Q25 of the control device 16$a$ (and transistor Q27 of control device 16$b$ - FIG. 3) to increase its conduction, increasing the current-handling capability of the output stage 15.

Conversely, if post processing testing finds the signal propagation delay of the electronic circuits 14$a$–14$n$ less than desired, (i.e., they are operating too fast), the current-handling capability of the output stages of the circuits must be reduced. Accordingly, a certain one or more of the external contacts 1, 2, 3 are connected to the external contact 4 (using low-temperature solder, for example) to obtain a $V_{ref}$ sufficient to place the control devices 16$a$ in a current stage that decreases the current-handling capability of the output stage of the corresponding gate, increasing the signal propagation time exhibited by that gate.

FIG. 4 illustrates an unexpected but pleasant advantage of the present invention, particularly when large interconnect distances and high capacitances are encountered: the ability to provide active pull-down to sharpen the falling edges of the output signals produced by the output stage incorporating the present invention. FIG. 4 shows only that portion of FIG. 3 that includes control device 16$a$, and identifies those elements of FIG. 3 that also appear in FIG. 4 with the same reference numerals. Added to that portion of the output stage 15 (FIG. 3) formed by transistors Q24 and Q25 are transistors Q28 and Q29, diode D1, and resistor R1. It should be understood that, although not specifically shown and described, a substantially similar circuit will be added to the output stage portion formed by transistors Q26, Q27.

Continuing with FIG. 4, transistor Q28 (which has its base lead connected to node B, the junction between resistor R2 and transistor Q22) forms a major current path with diode D1 and resistor R6 between $V_{cc}$ and ground potential to bias transistor Q29 in a conductive state. As FIG. 4 further shows, transistor Q29, a PNP transistor, is connected in the current path formed by the transistors Q24 and Q25.

Transistor Q29 (and its associated bias circuitry) operates to actively pull-down or discharge any capacitive impedance that the output stage portion 15$a$ must work into. Transistor Q29 has little or no effect on any rising edges of the output signal V1; it does, however, provide significant improvements on the falling edge of the output signal V1.

This improvement is achieved in the following manner: Transistor Q29 is biased by the bias circuit formed by the transistor Q28, diode D1, and resistor R6 (which has a value of approximately 30K–40K Ohms) to always be in the active state by node C being placed one diode drop below node D, forward biasing the emitter-base junction of transistor Q29. Assume node B is at a high voltage level, placing the output voltage V1 in a high state. Assume further that the circuit, of which FIG. 4 forms a part, has experienced a change of conditions so that node B drops to a low voltage state. Node C will quickly follow the drop of node B to momentarily increase the forward bias of the base emitter junction of transistor Q29. Transistor Q29, thereby, provides a very high current discharge path to quickly discharge any capacitive output impedance. As the voltage at node D drops, transistor Q29 conducts less, until a quiescent state is achieved.

The added circuitry shown in FIG. 4 does not affect low to high transitions of the output impedance V1 to any great extent—if at all. Even though a low to high voltage transition at node C may tend to push transistor Q29 toward cut-off, transistor Q24 will tend to compensate by "pumping" current into the output impedance.

As mentioned above, the present invention finds particular use in the output stages of digital gates and circuits implemented in ECL technology, and using emitter follower configuration output stages. As those skilled in the art are well aware, low to high output voltage transitions are typically much faster than the high to low transitions. To add the circuit of transistors Q28 and Q29, diode D1, and resistor R1, without the current source formed by the transistor Q25 and resistor R4 would not be effective. Thus, it is the addition of the control circuit 16a that provides the means and the basis for the addition of transistor Q29 and its associated advantages.

Illustrated in FIG. 5 is an alternate embodiment of the present invention. As shown, the output stage of a gate 38 includes a transistor Q24' and a resistor R6 connected in emitter-follower configuration. An output terminal V2' is connected to the junction between the resistance R6 and the emitter lead of the transistor Q24'. The transistor/resistor Q24'/R6 combination is connected between a supply voltage $V_{cc}$ and a (lower) reference potential $V_{ef}$, established by the control device 16'. As one can see in FIG. 5, with an established base drive current, and set values for $V_{cc}$ and R6, varying the reference potential $V_{ef}$ will vary the current conducted through R6, producing a concomitant variance in the output characteristics of the output stage 38. Thus, adjusting the reference potential $V_{ef}$ will result in adjusting the current-handling capability of the emitter follower formed by the Q24'/R6 combination.

The control device 16' functions to perform the adjustment of the reference potential $V_{ef}$. As illustrated in FIG. 5, the control device 16' comprises an amplifier 40 which receives, at its inverting (−) input the reference signal $V_{ref}$ produced by the DAC 18 (FIG. 2). The output of the amplifier 40 is coupled to the base lead of a transistor Q27'. The emitter lead of the transistor Q27' is connected to a DC supply voltage that is lower than the supply voltage $V_{cc}$, here a negative 5 volts DC. The collector lead of the transistor Q27', which establishes the reference potential $V_{ef}$, is connected to the free terminal of the resistance R6. In addition, the reference potential $V_{ef}$ is coupled back to the non-inverting (+) input of the amplifier 40.

The control circuit 16' functions to obtain much the same result as did the control circuit 16a (FIG. 3) insofar as increasing or decreasing the current-handling capability of the respective output stages 15 (FIG. 3) and 38 (FIG. 5) of one or more gates formed on the integrated circuit chip 12 are concerned. For example, assume that one or more of the gates 14a, 14b, ... 14n (FIG. 1) using the output stage 38 exhibits a signal propagation delay time greater than desired. This indicates that the output stage 38, or more specifically the Q24'/R6 emitter-follower configuration combination have a current-handling capability less than desired. To increase that current-handling capability, the reference V can be lowered, increasing the differential ($V_{cc} - V_{ef}$) across Q24'/R6. Thus, as before, selected ones or all of the external contacts 1, 2, 3 (FIG. 2) are connected to the external contact 4 to program the DAC 18 as necessary to develop a reference signal $V_{ref}$ sufficient to establish a reference potential $V_{ef}$ with $V_{ef}$ set at the desired value, the current-handling capability of the output stage 38 is thereby selected, and with it the signal propagation delay time.

Thus far, the invention has been illustrated as being implemented in bipolar circuit technology. However, the present invention can be implemented in other technologies. Shown in FIG. 6 is an MOS AND gate configuration incorporating the present invention, comprising a p-channel MOS transistor Q30 and two n-channel transistors Q31 and Q32. The three transistors are connected drain-to-source between two supply voltages $V_{dd}$ and $V_{ss}$, with the drain lead of transistor Q30 connected to $V_{dd}$ and the source lead of transistor Q30 connected to $V_{ss}$. Transistors Q31 and Q32 form the AND gate, with the respective gate leads forming the inputs to the gate for receiving data signals D1 and D2; terminal 41 forms the output terminal of the gate.

Transistor Q30 functions as a variable resistor whose resistance value is set by the reference voltage $V_{ref}$. The reference voltage $V_{ref}$ would be generated by a voltage source, such as the digital to analog converter (DAC 18) described in connection with the discussion of FIG. 2, except that here it would be constructed using MOS circuit technology and formed on the chip carrying the MOS circuit of FIG. 6. The reference voltage $V_{ref}$, therefore, can take on one of several selected values.

Depending upon the value of the reference $V_{ref}$ and selected, the transistor Q30 will exhibit a corresponding resistance value that, in turn, limits the amount of current that can be conducted by the transistors Q31 and Q32. It follows, therefore, that setting the equivalent resistance of transistor Q30 can compensate for process variations of the transistors Q31 and Q32, as well as the metallizing used to connect the transistors and output lead 41—in much the same manner as the control devices 16a and 16b (FIG. 3) do.

It will be remembered that the present invention may be used with a very large number of gates (remember, as pointed out above, "gate" is used herein to include a variety of logic modules—NAND/AND gates, NOR-/OR gates, multiplexers, counters, etc.), each having a control device 16 in its output stage. This may require more amplification than that provided by the emitter-follower configuration of Q20/R1 (FIG. 2) of the DAC 18 to drive this possible multitude of control devices 16. Thus, it should be understood that there may be required slave amplifiers of one sort or another interconnecting the DAC 18 and the individual control devices 16 to provide the necessary drive.

Illustrated in FIG. 7 is a test circuit 42 for use in determining the gate or signal propagation delays exhibited by the circuitry formed on an integrated circuit chip. As shown, the test circuit 42 is configured as a ring oscillator, comprising a two-input NOR gate 44 whose output is connected to a series-connected string of inverters 46a, 46b ... 46m. The output of the last inverter 46m is coupled back to one of the inputs of the two-input NOR gate 44, the other input receiving a TEST signal. The ring oscillator of test circuit 42 would also be formed on the integrated circuit chip 12 (FIG. 1 along with the DAC 18, and the control circuits 16 associated with the corresponding electronic circuits 14a, 14b ... 14n.

In operation, a known periodic TEST signal is applied to one input of the NOR gate 44, and the output of the inverter 46n monitored to determine the signal propagation delays of the electronic circuits formed on the integrated circuit chip 12. From this information a decision as to whether or not any adjustment of the current-handling capability of the output stages should be made and, if so, a determination of how much.

In summary, there has been disclosed a technique for regulating and "fine-tuning" the signal propagation delays of digital circuits, particularly those fabricated in integrated circuit form. And, while a preferred embodiment of the invention has been disclosed, it should be obvious that modifications and alterations can be made. For example, the DAC 18 (FIG. 2) can be programmed using fused links 50 (illustrated in phantom in FIG. 2) that replace the external contacts 1, 2, 3 (and 4, and tie the base circuits of transistors Q4, Q8 and Q11 to the supply voltage $V_{cc}$. During post-fabrication testing the fused-links can be interrupted (using laser-cutting, for example) to allow the associated base circuit to "float," allowing the corresponding base lead to be pulled to ground.

Thus, although the best modes contemplated for carrying out the present invention have been herein shown and described, it is apparent modification and variation may be made without departing from what is regarded as the subject matter of the invention.

We claim:

1. In an emitter-coupled logic (ECL) circuit of the type having an emitter follower output stage including a transistor having an emitter lead connected to an output terminal of the ECL circuit, the improvement comprising:
   a current source;
   circuit means coupling the emitter lead to the current source for operating in response to a control signal to increase current conduction between the output terminal and the current source, the circuit means including a first transistor element having emitter and collector leads connected to form a current path between the output terminal and the current source, and a base lead connected to receive the control signal; and
   a control circuit operable to sense a response time delay between a fall time of a first signal applied to the emitter follower output stage and an output signal appearing at the output terminal to form the control signal.

2. The ECL circuit of claim 1, wherein the emitter-follower output state includes an input terminal connected to receive the first signal, and wherein the control circuit comprises a second transistor element and and a diode connected so that the base-emitter junction of the second transistor element and the diode form a series path between the input terminal and the base terminal.

3. The ECL circuit of claim 1, the current source including a reference terminal connected to receive a limit signal that operates to set the range of current conducted by the current source, and generator means operable to produce the limit signal.

4. On a semiconductor chip fabricated to carry a plurality of electronic circuits each having an output stage operable to provide an output current, apparatus for regulation of the signal propagation delay exhibited by each of the electronic circuits, the apparatus comprising:

for each output stage a first circuit means coupled to such output stage and operable to limit the output current range in response to a limit signal; and
second circuit means coupled to each of the first circuit means and presettable to provide one of a number of reference signals, each of said number of reference signals defining an operable output current range of each such output stage;
setting means coupled to the second circuit means for fixing a one of the number of reference signals as the limit signal; and
each of the output stages having an output terminal for providing the output current thereat in response to an input signal applied to such output stage, and each output stage including third circuit means operably coupled to the output stage to provide an increased current during high to low transitions of the output current.

5. The apparatus of claim 4, wherein the reference signal is a voltage.

6. The apparatus of claim 4, wherein the reference signal is a current.

7. The apparatus of claim 4, wherein the second circuit means includes a digital-to-analog conversion means operable to selectively provide the reference signal.

8. The apparatus of claim 7, wherein the digital-to-analog conversion means includes a number of fused links capable of being selectively interrupted, the fused links forming the setting means.

9. The apparatus of claim 7, and wherein the setting means includes a plurality of contact elements and means for connecting the contact elements to one another to obtain the reference voltage.

10. The apparatus of claim 9, wherein the contact elements are capable of being connected in a number of interconnections, each interconnection obtaining a different value of the reference signal.

11. The apparatus of claim 10, wherein a one of the contact elements is coupled to a voltage potential, the other of the contact elements being selectively connected to the one contact element to obtain the reference voltage.

12. The apparatus of claim 11, including packaging mean forming an integrated circuit package containing the semiconductor chip, and means for making the contact elements accessible external of the integrated circuit package.

13. The apparatus of claim 4, including test circuit means formed on the semiconductor ship for determining the signal propagation delay exhibited by the electronic circuit.

14. The apparatus of claim 13, wherein the test circuit includes a plurality of substantially identical signal propagating circuit means connected in series and having an input and an output; and means for feeding back the output to the input.

15. The apparatus of claim 4, the third circuit means including transistor means having a first terminal coupled to the output terminal and a control terminal, and fourth circuit means coupled to the control terminal to communicate thereto high to low transistions of the output signal to increase conduction of the transistor means.

* * * * *